(12) United States Patent
Shimizu

(10) Patent No.: US 12,101,103 B2
(45) Date of Patent: Sep. 24, 2024

(54) INFORMATION PROCESSING DEVICE AND INFORMATION PROCESSING METHOD

(71) Applicant: Fujitsu Limited, Kawasaki (JP)

(72) Inventor: Toshihiro Shimizu, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 8 days.

(21) Appl. No.: 18/062,036

(22) Filed: Dec. 6, 2022

(65) Prior Publication Data

US 2023/0268936 A1 Aug. 24, 2023

(30) Foreign Application Priority Data

Feb. 18, 2022 (JP) ................. 2022-023575

(51) Int. Cl.
*H04L 27/06* (2006.01)
*G06F 11/10* (2006.01)
*H03M 13/00* (2006.01)

(52) U.S. Cl.
CPC ......... *H03M 13/6516* (2013.01); *G06F 11/10* (2013.01)

(58) Field of Classification Search
CPC . H04L 41/0853; H04L 69/14; H04L 49/1584; H04L 49/118; H04L 45/00; H04L 45/748; H04W 4/025; H04W 4/029; G06F 11/10
USPC .......................................... 375/341; 370/392
See application file for complete search history.

(56) References Cited

U.S. PATENT DOCUMENTS

| | | | |
|---|---|---|---|
| 2014/0153573 A1* | 6/2014 | Ramesh | H04L 45/748 370/392 |
| 2017/0117966 A1* | 4/2017 | Rickman | H04Q 11/00 |
| 2018/0287818 A1* | 10/2018 | Goel | H04L 45/64 |
| 2018/0293492 A1 | 10/2018 | Kalamkar et al. | |
| 2018/0375798 A1 | 12/2018 | Shimizu et al. | |
| 2020/0278892 A1* | 9/2020 | Nainar | H04L 67/10 |

(Continued)

FOREIGN PATENT DOCUMENTS

| | | |
|---|---|---|
| JP | 2019-008648 | 1/2019 |
| JP | 2020-077300 | 5/2020 |

(Continued)

*Primary Examiner* — Khai Tran
(74) *Attorney, Agent, or Firm* — Fujitsu Intellectual Property Center

(57) ABSTRACT

An information processing device coupled to a first switch among a plurality of switches and included in a plurality of information processing devices includes: a memory; and a processor coupled to the memory and configured to: store, in the memory, communication destination information based on a plurality of bit strings related to communication destinations of collective communication; and communicate with an information processing device connected to a second switch among the plurality of switches on a basis of the communication destination information. Some information processing devices that include the information processing device among the plurality of information processing devices participate in the collective communication, and the plurality of bit strings is selected from a bit string set related to the communication destinations of the plurality of information processing devices on a basis of the number of the some information processing devices.

10 Claims, 16 Drawing Sheets

(56) References Cited

U.S. PATENT DOCUMENTS

2020/0329288 A1* 10/2020 Minkenberg ....... H04Q 11/0005
2021/0357760 A1   11/2021 Tanaka et al.

FOREIGN PATENT DOCUMENTS

WO    2020/095729 A1    5/2020
WO    2021/111490 A1    6/2021

* cited by examiner

FIG. 5

| k | PRIMITIVE POLYNOMIAL |
|---|---|
| 1 | $1+x$ |
| 2 | $1+x+x^2$ |
| 3 | $1+x+x^3, 1+x^2+x^3$ |
| 4 | $1+x+x^4, 1+x^3+x^4$ |
| 5 | $1+x^2+x^5, 1+x+x^2+x^3+x^5, 1+x^3+x^5, 1+x+x^3+x^4+x^5,$ $1+x^2+x^3+x^4+x^5, 1+x+x^2+x^4+x^5$ |

FIG. 6

| INDEX q | POLYNOMIAL $x^q$ | BIT STRING | | | | INTEGER |
|---|---|---|---|---|---|---|
| -∞ | 0 | 0 | 0 | 0 | 0 | 0 |
| 0 | 1 | 0 | 0 | 0 | 1 | 1 |
| 1 | x | 0 | 0 | 1 | 0 | 2 |
| 2 | $x^2$ | 0 | 1 | 0 | 0 | 4 |
| 3 | $x^3$ | 1 | 0 | 0 | 0 | 8 |
| 4 | $x^4 = -1 - x = 1 + x$ | 0 | 0 | 1 | 1 | 3 |
| 5 | $x^5 = x(1+x) = x + x^2$ | 0 | 1 | 1 | 0 | 6 |
| 6 | $x^6 = x(x+x^2) = x^2 + x^3$ | 1 | 1 | 0 | 0 | 12 |
| 7 | $x^7 = x(x^2+x^3) = x^3 + x^4 = 1 + x + x^3$ | 1 | 0 | 1 | 1 | 11 |
| 8 | $x^8 = x(1+x+x^3) = x + x^2 + x^4 = 1 + x^2$ | 0 | 1 | 0 | 1 | 5 |
| 9 | $x^9 = x(1+x^2) = x + x^3$ | 1 | 0 | 1 | 0 | 10 |
| 10 | $x^{10} = x(x+x^3) = x^2 + x^4 = 1 + x + x^2$ | 0 | 1 | 1 | 1 | 7 |
| 11 | $x^{11} = x(1+x+x^2) = x + x^2 + x^3$ | 1 | 1 | 1 | 0 | 14 |
| 12 | $x^{12} = x(x+x^2+x^3) = x^2 + x^3 + x^4 = 1 + x + x^2 + x^3$ | 1 | 1 | 1 | 1 | 15 |
| 13 | $x^{13} = x(1+x+x^2+x^3) = x + x^2 + x^3 + x^4 = 1 + x^2 + x^3$ | 1 | 1 | 0 | 1 | 13 |
| 14 | $x^{14} = x(1+x^2+x^3) = x + x^3 + x^4 = 1 + x^3$ | 1 | 0 | 0 | 1 | 9 |
| 15 | $x^{15} = x(1+x^3) = x + x^4 = 1$ | 0 | 0 | 0 | 1 | 1 |

FIG. 7

| INDEX q | POLYNOMIAL $x^q$ | BIT STRING | INTEGER |
|---|---|---|---|
| 0 | 1 | 0001 | 1 |
| 1 | $x$ | 0010 | 2 |
| 2 | $x^2$ | 0100 | 4 |
| 3 | $x^3$ | 1000 | 8 |
| 4 | $x^3+1$ | 1001 | 9 |
| 5 | $x^3+x+1$ | 1011 | 11 |
| 6 | $x^3+x^2+x+1$ | 1111 | 15 |
| 7 | $x^3+x+1$ | 0111 | 7 |
| 8 | $x^3+x^2+x$ | 1110 | 14 |
| 9 | $x^2+1$ | 0101 | 5 |
| 10 | $x^3+x$ | 1010 | 10 |
| 11 | $x^3+x^2+1$ | 1101 | 13 |
| 12 | $x+1$ | 0011 | 3 |
| 13 | $x^2+x$ | 0110 | 6 |
| 14 | $x^3+x^2$ | 1100 | 12 |
| 15 | 1 | 0001 | 1 |

FIG. 8

|   | ID1 | ID2 | ... | IDd |
|---|---|---|---|---|
| 1 | C(1,1) | C(1,2) | ... | C(1,d) |
| 2 | C(2,1) | C(2,2) | ... | C(2,d) |
| ⋮ | ⋮ | ⋮ | ⋮ | ⋮ |
| n | C(n,1) | C(n,2) | ... | C(n,d) |

FIG. 13

```
B:={TARGET k-DIGIT BIT STRING}, a=()

function f()
    if B IS EMPTY
        OUTPUT a AND END

ELEMENT e OF foreach B
        DELETE e FROM B
        ADD e TO END OF a
        if NUMBER OF TERMS OF a IS SMALLER THAN n, AND
        LAST k TERMS OF a ARE LINEARLY INDEPENDENT f()
        if NUMBER OF TERMS OF a IS n, AND ALL CONSECUTIVE
        k TERMS OF a ARE LINEARLY INDEPENDENT OUTPUT a AND END DELETE e AT END OF a
        ADD e TO B
EXECUTE f()
```

INFORMATION PROCESSING DEVICE AND INFORMATION PROCESSING METHOD

CROSS-REFERENCE TO RELATED APPLICATION

This application is based upon and claims the benefit of priority of the prior Japanese Patent Application No. 2022-23575, filed on Feb. 18, 2022, the entire contents of which are incorporated herein by reference.

FIELD

The present embodiment discussed herein is related to information processing.

BACKGROUND

In a case of executing parallel distributed processing in high-performance computing (HPC), a network topology of a communication network that connects servers or switches is important in order to transmit and receive data more efficiently at low cost. The network topology represents a connection configuration of servers or switches.

Japanese Laid-open Patent Publication No. 2019-8648, Japanese Laid-open Patent Publication No. 2020-77300, International Publication Pamphlet No. WO 2021/111490, and U.S. Patent Application Publication No. 2018/0293492 are disclosed as related art.

SUMMARY

According to an aspect of the embodiments, an information processing device coupled to a first switch among a plurality of switches and included in a plurality of information processing devices includes: a memory; and a processor coupled to the memory and configured to: store, in the memory, communication destination information based on a plurality of bit strings related to communication destinations of collective communication; and communicate with an information processing device connected to a second switch among the plurality of switches on a basis of the communication destination information. Some information processing devices that include the information processing device among the plurality of information processing devices participate in the collective communication, and the plurality of bit strings is selected from a bit string set related to the communication destinations of the plurality of information processing devices on a basis of the number of the some information processing devices.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 5 is a table illustrating primitive polynomials;
FIG. 6 is a table illustrating a first example of a bit string set;
FIG. 7 is a table illustrating a second example of the bit string set;
FIG. 8 is a table illustrating a communication table;
FIG. 13 is a diagram illustrating a pseudocode.

DESCRIPTION OF EMBODIMENTS

There is known an information processing system that avoids occurrence of path contention in a case of performing all-reduce communication in a full mesh system in relation to the parallel distributed processing. A distributed deep learning system capable of performing distributed deep learning processing at a higher speed is also known. An abstraction library that enables scalable distributed machine learning is also known.

The information processing system of Japanese Laid-open Patent Publication No. 2019-8648 includes a plurality of switches whose network topology is full mesh, and a plurality of servers is connected to each switch. The full mesh represents a connection configuration in which each switch in a communication network is directly connected to every other switch. According to the full mesh network topology, more servers can be connected with fewer switches.

In a case of performing all-reduce communication between servers in this information processing system, each server generates a bit string indicating a switch to which a communication destination server is connected on the basis of a communication table, and performs communication with the communication destination server using the generated bit string. Therefore, the path contention can be avoided.

All-reduce refers to processing in which all of servers share operation results of data held by all the servers for pre-specified operations, and the all-reduce communication refers to communication performed for all-reduce. The path contention means that a plurality of packets is transmitted at the same time in the same direction on one path in a communication network.

According to the information processing system of Japanese Laid-open Patent Publication No. 2019-8648, the path contention can be avoided in the all-reduce communication using all the servers. However, there are cases where it is desired to put a partial job using only an appropriate number of servers according to a calculation size, depending on a target of the parallel distributed processing. Therefore, it is desirable to be able to flexibly change the number of servers that participates in the all-reduce communication.

Note that this problem is not limited to the case where servers in a full mesh communication network perform the all-reduce communication but occurs in a case where information processing devices (computers) in various communication networks perform various collective communications. The collective communication is one-to-many, many-to-one, or many-to-many communication performed among a plurality of communication entities such as information processing devices.

In one aspect, an objective of the present embodiment is to implement collective communication in which some information processing devices among a plurality of information processing devices connected to switches in a communication network participate.

Hereinafter, an embodiment will be described in detail with reference to the drawings.

Figure 1:
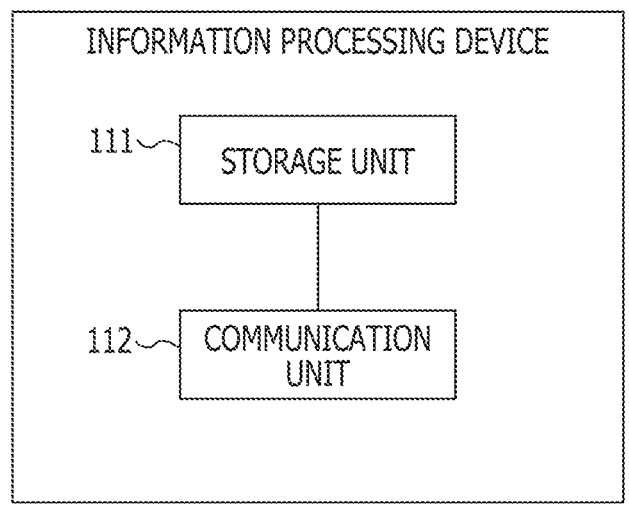
FIG. 1 is a functional configuration diagram of an information processing device.

FIG. 1 illustrates a functional configuration example of an information processing device according to an embodiment. An information processing device 101 in FIG. 1 is one of a plurality of information processing devices, and includes a storage unit 111 and a communication unit 112. The plurality of information processing devices is connected to a first switch among a plurality of switches.

The storage unit 111 stores communication destination information based on a plurality of bit strings related to communication destinations of collective communication, and the communication unit 112 communicates with an information processing device connected to a second switch among the plurality of switches on the basis of the communication destination information.

Some information processing devices including the information processing device 101 among the plurality of information processing devices participate in the collective communication. The plurality of bit strings related to communication destinations of the collective communication is selected from a bit string set related to communication destinations of the plurality of information processing devices on the basis of the number of some information processing devices.

According to the information processing device 101 of FIG. 1, it is possible to implement the collective communication in which some information processing devices among the plurality of information processing devices connected to switches in a communication network participate.

Figure 2:
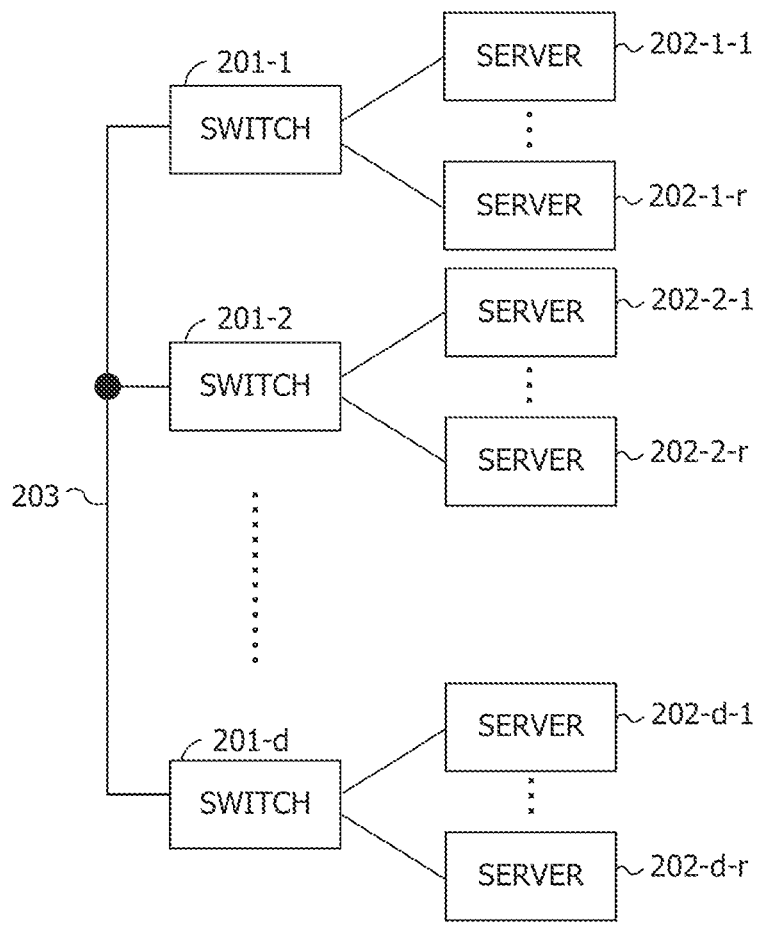
FIG. 2 is a configuration diagram of an information processing system.

FIG. 2 illustrates a configuration example of an information processing system including the information processing device 101 in FIG. 1. The information processing system in FIG. 2 includes switches 201-1 to 201-$d$ (d is an integer equal to or greater than 2) and servers 202-$j$-1 to 202-$j$-$r$ (j=1 to d and r is an integer equal to or greater than 2).

The server 202-$j$-$i$ (i=1 to r) corresponds to the information processing device 101 in FIG. 1. In one example, $d=2^k$ (where k is an integer equal to or greater than 1) and $r=d-1=2^k-1$.

The switches 201-1 to 201-$d$ are connected to each other by a communication network 203. The network topology of the communication network 203 is full mesh. The switch 201-$j$ may be a switch based on infiniband.

The number of switches 201-$j$ included in the information processing system is d, and the number of servers 202-$j$-$i$ connected to each switch 201-$j$ is r. Therefore, the number of servers 202-$j$-$i$ included in the information processing system is d*r.

The r servers 202-$j$-$i$ connected to each switch 201-$j$ communicate via the switch 201-$j$. The server 202-$j$-$i$ connected to the switch 201-$j$ and the server 202-$h$-$i$ connected to the switch 201-$h$ (h≠j) communicate via the switch 201-$j$, the communication network 203, and the switch 201-$h$.

Each server 202-$j$-$i$ performs parallel distributed processing while communicating with other servers 202-$j$-$i$. The parallel distributed processing may be distributed machine learning.

In the case where the network topology of the communication network 203 is full mesh, $d=2^k$, and $r=2^k-1$, all-reduce communication that avoids occurrence of the path contention can be easily implemented.

Figure 3:
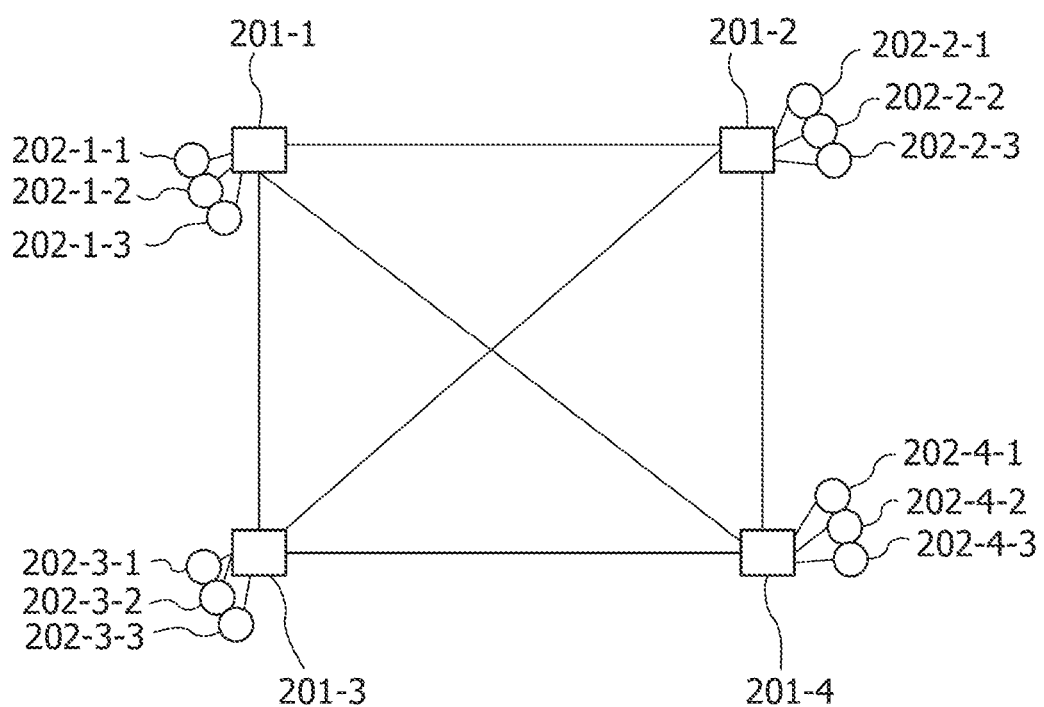
FIG. 3 is a configuration diagram of the information processing system in a case of k=2.

FIG. 3 illustrates a configuration example of the information processing system in a case of k=2. The information processing system of FIG. 3 includes the switches 201-1 to 201-4 and the servers 202-$j$-1 to 202-$j$-3 (j=1 to 4).

In this case, the information processing system includes four switches 201-$j$, and each switch 201-$j$ is connected to three servers 202-$j$-$i$. Accordingly, the information processing system includes twelve servers 202-$j$-$i$.

In the collective communication performed within the information processing system, all of the r servers 202-$j$-$i$ connected to each switch 201-$j$ may participate in the collective communication, or only some servers 202-$j$-$i$ may participate in the collective communication. The collective communication may be all-reduce communication, all-gather communication, or the like.

In the collective communication in which only some servers 202-$j$-$i$ connected to each switch 201-$j$ participate, any server 202-$j$-$i$ connected to any switch 201-$j$ acts as a control server. The control server generates a communication table indicating communication destinations of collective communication and distributes the communication table to each server 202-$j$-$i$ that participates in the collective communication. The control server may be the server 202-$j$-$i$ that participates in the collective communication, or the server 202-$j$-$i$ that does not participate in the collective communication.

Figure 4:
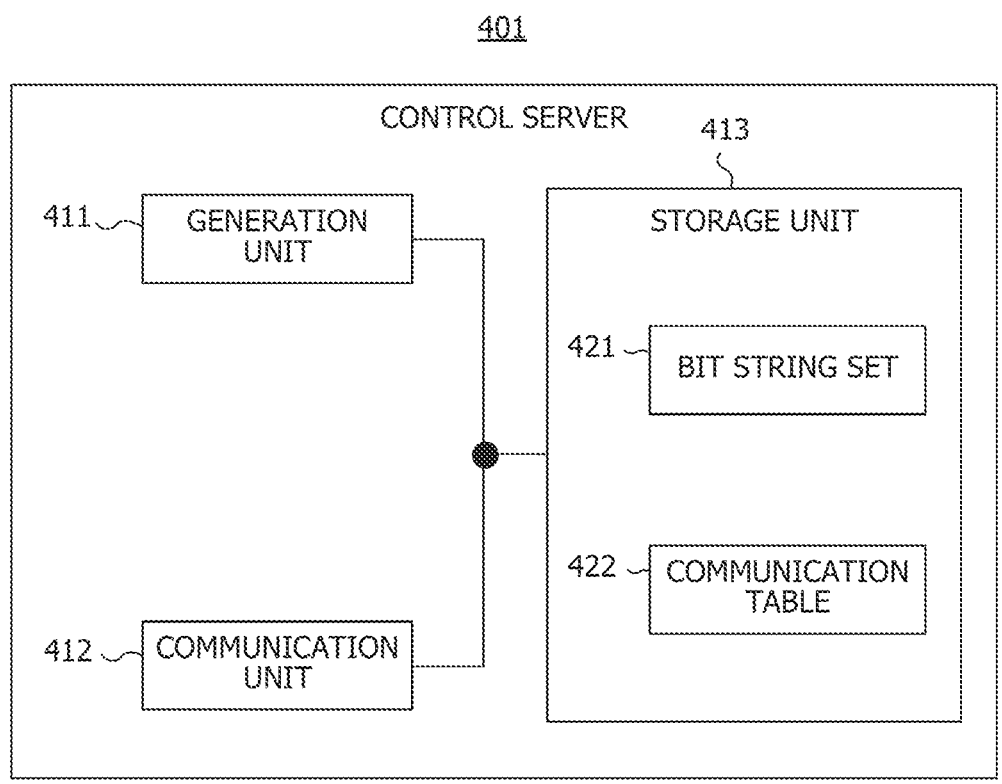
FIG. 4 is a functional configuration diagram of a control server.

FIG. 4 illustrates a functional configuration example of the control server. A control server 401 in FIG. 4 includes a generation unit 411, a communication unit 412, and a storage unit 413.

Before the collective communication is started, the generation unit 411 generates a bit string set 421 and stores the bit string set 421 in the storage unit 413. The bit string set 421 corresponds to the bit string set related to communication destinations of a plurality of information processing devices.

The generation unit 411 can generate the bit string set 421 by, for example, a greedy algorithm based on a torus method described in Japanese Laid-open Patent Publication No. 2019-8648. In this case, the bit string set 421 includes (d−1) bit strings corresponding to integers from 1 to d−1, and the length of each bit string is k bits. When the (d−1) bit strings included in the bit string set 421 are arranged in a circle, any consecutive k bit strings are linearly independent.

k bit strings having k bits being linearly independent means that a calculation result is not 0 regardless of a combination of selected bit strings when one or a plurality of bit strings is selected from the k bit strings and exclusive OR is calculated. Note that it is assumed that the exclusive OR of one bit string is the bit string itself.

For example, no matter how one or a plurality of bit strings is selected from three bit strings 001, 010, and 100, the exclusive OR will not be zero. Therefore, 001, 010, and 100 are linearly independent.

Meanwhile, when 1010, 1111 and 0101 are selected from four bit strings of 1010, 1111, 0101 and 1011, the exclusive OR is 0000. Therefore, 1010, 1111, 0101, and 1011 are not linearly independent.

The generation unit 411 can also generate the bit string set 421 using a Galois field $GF(2^k)$ generated from a kth-order primitive polynomial m(x). The Galois field is sometimes called finite field.

In this case, the generation unit 411 selects the primitive polynomial m(x) in advance, and generates polynomials and bit strings respectively corresponding to $2^k$ elements of $GF(2^k)$ on the basis of the selected primitive polynomial m(x).

Arithmetic operations are defined for the generated polynomials and bit strings. Addition and subtraction are similar to normal addition and subtraction. Multiplication is defined using polynomial multiplication and division. For example, bit strings $B1=b1_{k-1}b1_{k-2} \ldots b1_0$ and $B2=b2_{k-1}b2_{k-2} \ldots b2_0$ are expressed by the following polynomial.

$$B1\ b1_{k-1}x^{k-1}+b1_{k-2}x^{k-2}+\ldots+b1_0\ B2\ b2_{k-1}x^{k-1}+b2_{k-2}x^{k-2}+\ldots+b2_0$$

A multiplication result of B1 and B2 is defined as a bit string corresponding to a remainder when the multiplication result of these polynomials is divided by m(x).

Division is defined as multiplication of a polynomial corresponding to a dividend by an inverse element of the polynomial corresponding to a divisor. Since a polynomial f(x) and the minimum polynomial m(x) of f(x) are relatively prime each other, there are polynomials A(x) and B(x) that satisfy the following expression.

$$f(x)A(x)+m(x)B(x)=1 \quad (1)$$

In this case, A(x) may be used as the inverse element of f(x).

FIG. 5 illustrates examples of the primitive polynomials m(x) in the cases of k=1 to 5. In the cases of k=3 and k=4, two types of m(x) are present, and in the case of k=5, six types of m(x) are present.

FIG. 6 illustrates a first example of the bit string set 421 generated using $GF(2^k)$. In this example, k=4 and $m(x)=x^4+x+1$. A polynomial $x^q$ is defined using an index q and transformed with a condition m(x)=0.

The bit string corresponds to the transformed polynomial $x^q$. The first (most significant bit) bit value represents a coefficient of an $x^3$ term, the second bit value represents a coefficient of an $x^2$ term, the third bit value represents a coefficient of an $x^1$ term, and the fourth (least significant bit) bit value represents a coefficient of an $x^0$ term.

For example, the transformed polynomial of an polynomial $x^4$ is 1+x. In this case, the coefficients of the $x^3$ and $x^2$ terms are 0, and the coefficients of the $x^1$ and $x^0$ terms are 1. Therefore, the bit string corresponding to the polynomial $x^4$ is 0011.

An integer represents an integer corresponding to a bit string and is obtained by converting the bit string into a decimal number. For example, the integer corresponding to the bit string 0011 is 3.

When $(2^k-1)$ bit strings respectively corresponding to the polynomials $x^0$ to $x^{2^{\wedge}k-2}$ are arranged in a circle among the bit strings respectively corresponding to the $2^k$ elements of $GF(2^k)$, any consecutive k bit strings are linearly independent. The reason will be described below.

s integers I1, I2, . . . , Is that satisfy the following expressions are present, assuming that the bit strings respectively corresponding to the consecutive k polynomials $x^t$ to $x^{t+k-1}$ are not linearly independent in the $(2^k-1)$ bit strings respectively corresponding to the polynomials $x^0$ to $x^{2k-2}$.

$$t \leq I1, I2, \ldots, Is \leq t+k-1 \quad (2)$$

$$x^{I1}+x^{I2}+\ldots+x^{Is}=0 \quad (3)$$

The following expression is obtained when dividing both sides of Expression (3) by $x^t$.

$$x^{I1-t}+x^{I2-t}+\ldots+x^{Is-t}=0 \quad (4)$$

Meanwhile, the following expression is obtained from Expression (2).

$$0 \leq I1-t, I2-t, \ldots, Is-t \leq k-1 \quad (5)$$

The bit string corresponding to $x^I$ for an integer I that satisfies $0 \leq I \leq k-1$ is a bit string 0 . . . 010 . . . 0 in which the I-th bit value from the least significant bit is 1 and all of the other bit values are 0. Therefore, in a case where Expression (5) holds, Expression (4) does not hold.

Such contradiction proves that the original assumption is wrong. Therefore, for the any consecutive k polynomials $x^t$ to $x^{t+k-1}$, the corresponding k bit strings are linearly independent.

Therefore, the generation unit 411 adopts $(2^k-1)$ bit strings respectively corresponding to the polynomials $x^0$ to $x^{2^{\wedge}k-2}$ as the bit string set 421. In the example of FIG. 6, the bit string set 421 includes fifteen bit strings corresponding to q=0 to 14, and the bit string 0000 corresponding to q=−∞ is excluded from the bit string set 421.

FIG. 7 illustrates a second example of the bit string set 421 generated using $GF(2^k)$. In this example, k=4 and $m(x)=x^4+x^3+1$. The generation unit 411 adopts fifteen bit strings corresponding to q=0 to 14 as the bit string set 421.

By determining the communication destination of each server 202-*j-i* using such a bit string set 421, it is possible to avoid occurrence of the path contention in the case where all the (d−1) servers 202-*j-i* connected to each switch 201-*j* participate in the all-reduce communication.

Next, the generation unit 411 generates a communication table 422 using the bit string set 421 and stores the communication table 422 in the storage unit 413. The communication table 422 corresponds to communication destination information based on a plurality of bit strings regarding communication destinations of the collective communication.

In a case where n (k≤n≤d−1) servers 202-*j-i* among (d−1) servers 202-*j-i* connected to each switch 201-*j* participate in the collective communication, the generation unit 411 selects n bit strings included in the bit string set 421 as a partial bit string set. The generation unit 411 then generates the communication table 422 using the selected n bit strings.

In the case where the bit string set 421 is generated using $GF(2^k)$, the generation unit 411 selects the bit strings respectively corresponding to n elements specified on the basis of n among the $2^k$ elements of $GF(2^k)$ as the partial bit string set.

For example, in a case where n is a divisor of $2^k-1$, the generation unit 411 specifies the n elements respectively corresponding to the polynomials $x^0, x^p, x^{2p}, \ldots,$ and $x^{(n-1)p}$ by selecting one element every p from $GF(2^k)$ using p calculated by the following expression.

$$p=(2^k-1)/n \quad (6)$$

When the bit strings respectively corresponding to the specified n elements are arranged in a circle, any consecutive k bit strings are linearly independent.

For example, in the case of k=4 and n=5, p=3. Therefore, in the case where the bit string set 421 of FIG. 7 is generated, the following bit strings corresponding to the polynomials $x^0, x^3, x^6, x^9,$ and $x^{12}$ are selected as the partial bit string set.

$x^0$ 0001 $x^3$ 1000 $x^6$ 1111 $x^9$ 0101 $x^{12}$ 0011

By generating the bit string set 421 using $GF(2^k)$, it is possible to easily generate the partial bit string set in the case where n is a divisor of $2^k-1$.

FIG. 8 illustrates an example of the communication table 422. The communication table 422 in FIG. 8 is a table with n rows and d columns. 1 to n represent communication phases, and ID1 to IDd represent identification information of the switches 201-*j* (j=1 to d). A k-bit bit string corresponding to the integer j−1 is used as IDj. Hereinafter, the switch 201-*j* indicated by IDj may be referred to as a switch IDj.

A cell C(u, j) in the row u and column j (u=1 to n) of the communication table 422 includes pieces of communication destination identification information indicating the respective communication destinations of n servers 202-*j*-1 to 202-*j*-*n* connected to the switch IDj in the communication phase u. Therefore, C(u, j) includes n pieces of communication destination identification information. Each communication destination identification information represents identification information of the switch 201-*h* to which the server 202-*h*-*i*, which is the communication destination of the server 202-*j*-*i*, is connected.

The generation unit 411 calculates a communication destination identification information ID(u, j, i) (u=1 to n, j=1 to d, and i=1 to n) in the communication phase u of the server 202-*j*-*i* connected to the switch IDj by the following expression and records the calculated communication destination identification information ID in the communication table 422.

$$ID(u,j,i) = IDj \text{ xor } a(u+i) \quad (7)$$

a(i) represents the i-th bit string among the n bit strings included in the partial bit string set, and xor represents the exclusive OR of the bit strings. Note that the index i of a(i) is cyclically defined such that a(i+n)=a(i).

By calculating the ID(u, j, i) by Expression (7), it is possible to easily determine the communication destination of each server 202-*j*-*i* in the collective communication.

The generation unit 411 transmits the communication table 422 to each server 202-*j*-*i* that participates in the collective communication via the communication unit 412.

Figure 9:
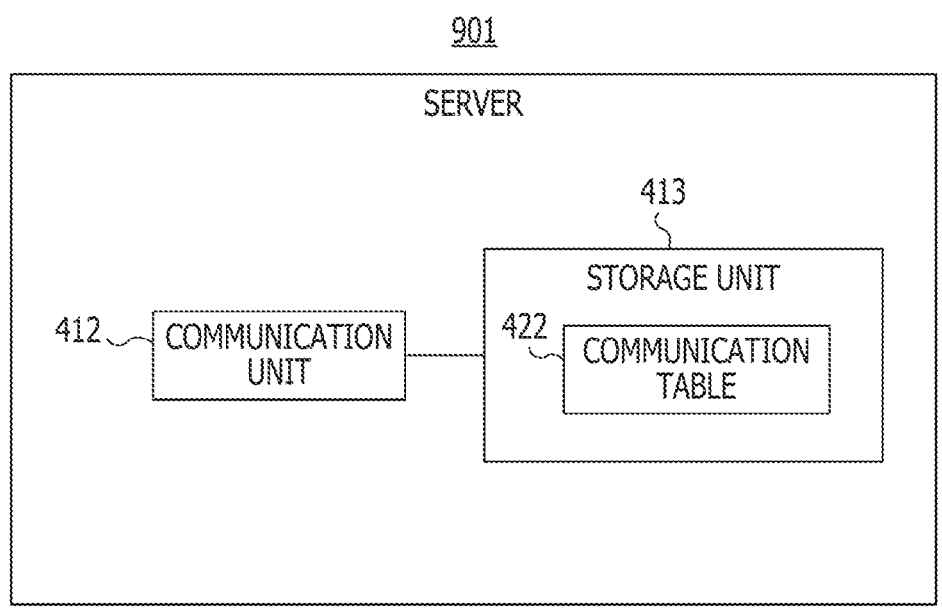
FIG. 9 is a functional configuration diagram of a server.

FIG. 9 illustrates a functional configuration example of each server 202-*j*-*i* that participates in the collective communication. A server 901 in FIG. 9 includes the communication unit 412 and the storage unit 413. The communication unit 412 receives the communication table 422 from the control server 401, and the storage unit 413 stores the received communication table 422.

Next, a procedure of the collective communication in the information processing system of FIG. 2 will be described. As an example, the all-reduce communication in which the n servers 202-*j*-*i* connected to each switch 201-*j* participate is performed in the following procedure.

(P1) The communication units 412 of the n servers 202-*j*-*i* connected to each switch 201-*j* perform the all-reduce communication among the n servers 202-*j*-*i* connected to the same switch 201-*j*.

(P2) The communication units 412 of the n servers 202-*j*-*i* connected to each switch 201-*j* perform the all-reduce communication with the server 202-*h*-*i* connected to the different switch 201-*h*. In this case, communication from the communication phase 1 to the communication phase n is executed in order.

In the communication phase u, the communication unit 412 of the i-th server 202-*j*-*i* connected to the switch 201-*j* acquires ID(u, j, i) from C(u, j) of the communication table 422. Then, the communication unit 412 transmits and receives data to and from the i-th server 202-*h*-*i* connected to the switch 201-*h* indicated by the acquired ID(u, j, i).

Note that the control server 401 may be included in the server 202-*j*-*i* that participates in the all-reduce communication.

As described above, any continuous k bit strings are linearly independent among a(u+1) to a(u+n) to be used to calculate ID(u, j, i) to ID(u, j, n). Therefore, by calculating the ID(u, j, i) by Expression (7) and executing the communication in the above-described procedure, operation results of the data held by the d*n servers 202-*j*-*i* can be shared by all the servers.

Therefore, the all-reduce communication in which only the n servers 202-*j*-*i* among (d−1) servers 202-*j*-*i* connected to each switch 201-*j* participate is implemented.

Figure 10:
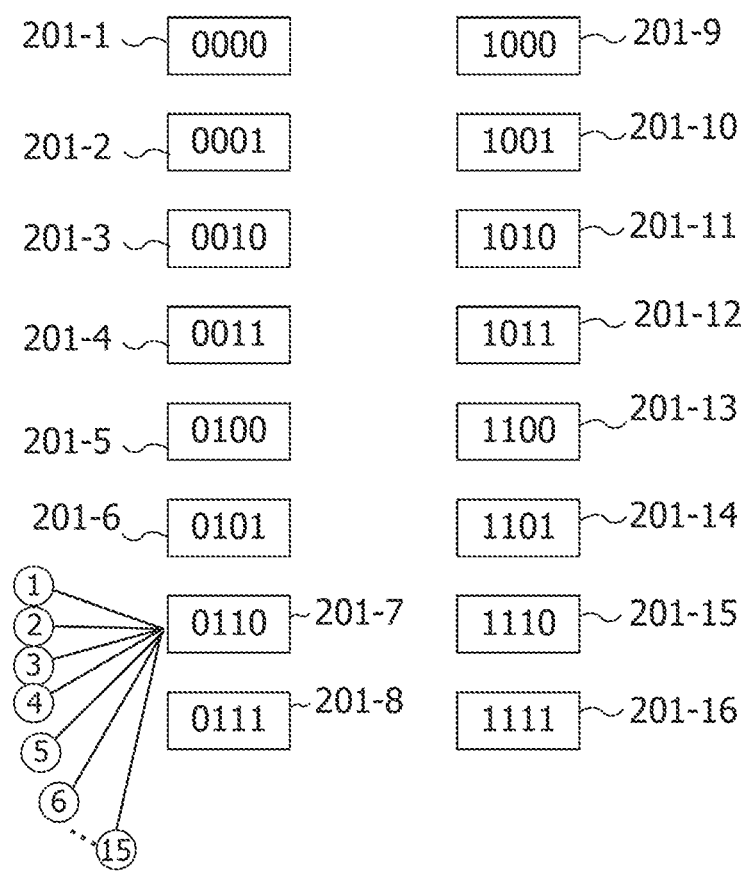
FIG. 10 is a diagram illustrating switches included in the information processing system in a case of k=4.

FIG. 10 illustrates an example of the switches 201-*j* included in the information processing system in the case of k=4. The information processing system in FIG. 10 includes the switches 201-1 to 201-16. A 4-bit bit string corresponding to the integer j−1 is assigned as IDj to each switch 201-*j*.

Each circle connected to the switch 201-7 represents one of the fifteen servers 202-7-*i*, and the number i (i=1 to 15) inside the circle represents the i-th server 202-7-*i*. Note that the fifteen servers 202-*j*-*i* connected to each of the switches 201-1 to 201-6 and the switches 201-8 to 201-16 are omitted.

In the case of n=5, the servers 202-*j*-1 to 202-*j*-5 connected to each switch 201-*j* participate in the all-reduce communication, and the servers 202-*j*-6 to 202-*j*-15 do not participate in the all-reduce communication. "0001, 1000, 1111, 0101, 0011" is used as the partial bit string set, and the following bit strings are used as a(1) to a(5).

a(1)=0001 a(2)=1000 a(3)=1111 a(4)=0101 a(5)=0011

In this case, the communication table 422 becomes a table with five rows and sixteen columns, and in the procedure (P2), communications of communication phase 1 to communication phase 5 are executed in order.

Figure 11:
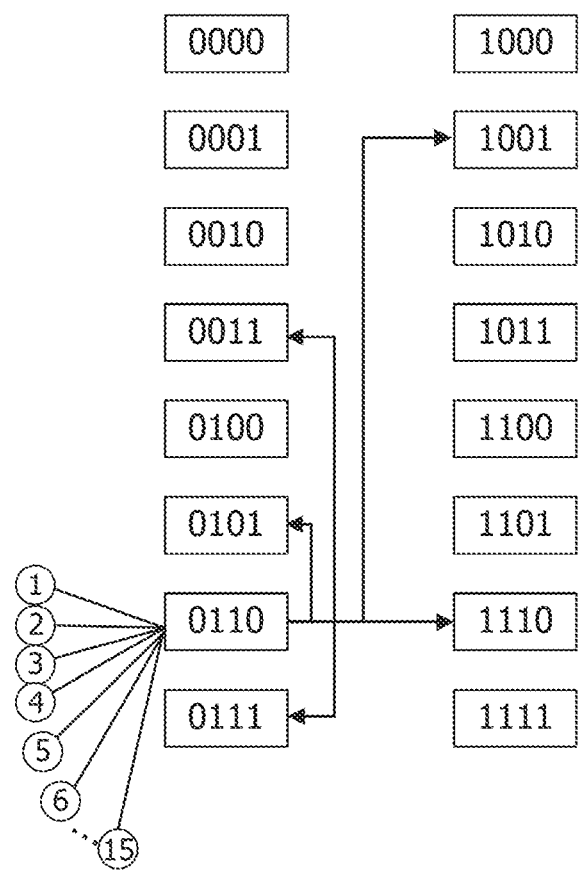
FIG. 11 is a diagram illustrating communication in a communication phase 2.

FIG. 11 illustrates an example of communication in the communication phase 2 performed by the servers 202-7-1 to 202-7-5 connected to the switch 0110 in the information processing system of FIG. 10. ID(2, 7, 1) to ID(2, 7, 5) included in C(2, 7) of the communication table 422 are calculated as follows using Expression (7).

$$ID(2, 7, 1) = 0110 \text{ xor } a(2+1) \quad (11)$$
$$= 0110 \text{ xor } a(3)$$
$$= 0110 \text{ xor } 1111$$
$$= 1001$$
$$ID(2, 7, 2) = 0110 \text{ xor } a(2+2) \quad (12)$$
$$= 0110 \text{ xor } a(4)$$
$$= 0110 \text{ xor } 0101$$
$$= 0011$$
$$ID(2, 7, 3) = 0110 \text{ xor } a(2+3) \quad (13)$$
$$= 0110 \text{ xor } a(5)$$
$$= 0110 \text{ xor } 0011$$
$$= 0101$$
$$ID(2, 7, 4) = 0110 \text{ xor } a(2+4) \quad (14)$$
$$= 0110 \text{ xor } a(1)$$
$$= 0110 \text{ xor } 0001$$

-continued $$= 0111$$

$$ID(2, 7, 5) = 0110 \text{ xor } a(2 + 5) \quad (15)$$

$$= 0110 \text{ xor } a(2)$$

$$= 0110 \text{ xor } 1000$$

$$= 1110$$

Therefore, the server 202-7-1 connected to the switch 0110 communicates with the server 202-10-1 connected to the switch 1001 indicated by the ID(2, 7, 1). The server 202-7-2 connected to the switch 0110 communicates with the server 202-4-2 connected to the switch 0011 indicated by the ID(2, 7, 2).

The server 202-7-3 connected to the switch 0110 communicates with the server 202-6-3 connected to the switch 0101 indicated by the ID(2, 7, 3). The server 202-7-4 connected to the switch 0110 communicates with the server 202-8-4 connected to the switch 0111 indicated by the ID(2, 7, 4).

The server 202-7-5 connected to the switch 0110 communicates with the server 202-15-5 connected to the switch 1110 indicated by the ID(2, 7, 5).

Figure 12:
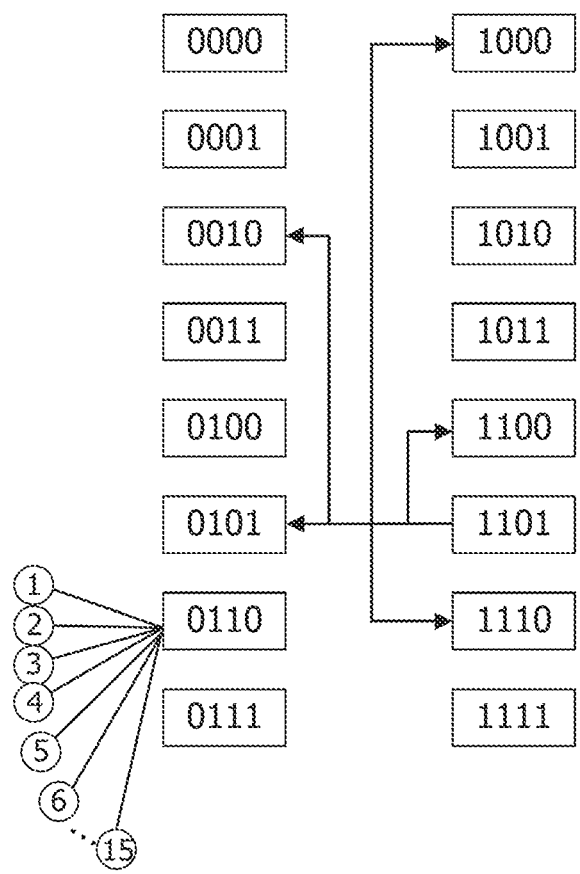
FIG. 12 is a diagram illustrating communication in a communication phase 4.

FIG. 12 illustrates an example of communication in the communication phase 4 performed by the servers 202-14-1 to 202-14-5 connected to the switch 1101 in the information processing system of FIG. 10. ID(4, 14, 1) to ID(4, 14, 5) included in C(4, 14) of the communication table 422 are calculated as follows using Expression (7).

$$ID(4, 14, 1) = 1101 \text{ xor } a(4 + 1) \quad (16)$$

$$= 1101 \text{ xor } a(5)$$

$$= 1101 \text{ xor } 0011$$

$$= 1110$$

$$ID(4, 14, 2) = 1101 \text{ xor } a(4 + 2) \quad (17)$$

$$= 1101 \text{ xor } a(1)$$

$$= 1101 \text{ xor } 0001$$

$$= 1100$$

$$ID(4, 14, 3) = 1101 \text{ xor } a(4 + 3) \quad (18)$$

$$= 1101 \text{ xor } a(2)$$

$$= 1101 \text{ xor } 1000$$

$$= 0101$$

$$ID(4, 14, 4) = 1101 \text{ xor } a(4 + 4) \quad (19)$$

$$= 1101 \text{ xor } a(3)$$

$$= 1101 \text{ xor } 1111$$

$$= 0010$$

$$ID(4, 14, 5) = 1101 \text{ xor } a(4 + 5) \quad (20)$$

$$= 1101 \text{ xor } a(4)$$

$$= 1101 \text{ xor } 0101$$

$$= 1000$$

Therefore, the server 202-14-1 connected to the switch 1101 communicates with the server 202-15-1 connected to the switch 1110 indicated by the ID(4, 14, 1). The server 202-14-2 connected to the switch 1101 communicates with the server 202-13-2 connected to the switch 1100 indicated by the ID(4, 14, 2).

The server 202-14-3 connected to the switch 1101 communicates with the server 202-6-3 connected to the switch 0101 indicated by the ID(4, 14, 3). The server 202-14-4 connected to the switch 1101 communicates with the server 202-3-4 connected to the switch 0010 indicated by the ID(4, 14, 4).

The server 202-14-5 connected to the switch 1101 communicates with the server 202-9-5 connected to the switch 1000 indicated by the ID(4, 14, 5).

The method of selecting the partial bit string set using p in Expression (6) is effective in the case where n is a divisor of $2^k-1$. Meanwhile, in the case where n is not a divisor of $2^k-1$, the generation unit 411 can select the partial bit string set from the bit string set 421 by the greedy algorithm using n.

FIG. 13 illustrates an example of a pseudocode for selecting the partial bit string set by the greedy algorithm using n. B in FIG. 13 represents the bit string set 421, and a represents the partial bit string set.

For example, in the case of k=3, the generation unit 411 can generate the bit string set 421 as follows.

$$B = \{001, 010, 011, 100, 101, 110, 111\} \quad (21)$$

In the case of n=5, the generation unit 411 generates the partial bit string set in the following procedure according to the pseudocode in FIG. 13.

(P11) The generation unit 411 deletes 001 from B and adds 001 to the end of a. Therefore, a=(001) and B={010, 011, 100, 101, 110, 111} are obtained. Then, the generation unit 411 recursively calls f( ).

(P12) The generation unit 411 deletes 011 from B and adds 011 to the end of a. Therefore, a=(001, 011) and B={010, 100, 101, 110, 111} are obtained. Then, the generation unit 411 recursively calls f( ).

(P13) The generation unit 411 deletes 010 from B and adds 010 to the end of a. Therefore, a=(001, 011, 010) and B={100, 101, 110, 111} are obtained.

However, the exclusive OR of the last three terms 001, 011, and 010 of a is 000, so 001, 011, and 010 are not linearly independent. Therefore, the generation unit 411 deletes 010 at the end of a and adds 010 to B. Therefore, a=(001, 011) and B={010, 100, 101, 110, 111} are again obtained.

(P14) The generation unit 411 deletes 100 from B and adds 100 to the end of a. Therefore, a=(001, 011, 100) and B={010, 101, 110, 111} are obtained. Since the last three terms 001, 011, and 100 of a are linearly independent, the generation unit 411 recursively calls f( ).

(P15) The generation unit 411 deletes 010 from B and adds 010 to the end of a. Therefore, a=(001, 011, 100, 010) and B={101, 110, 111} are obtained. Since the last three terms 011, 100, and 010 of a are linearly independent, the generation unit 411 recursively calls f( ).

(P16) The generation unit 411 deletes 101 from B and adds 101 to the end of a. Therefore, a=(001, 011, 100, 010, and 101) and B={110, 111} are obtained. The number of terms of a is 5, and when the five bit strings included in a are arranged in a circle, any consecutive three terms are linearly independent. Therefore, the generation unit 411 selects the five bit strings included in a as the partial bit string set and terminates the processing.

The greedy algorithm using n works up to about k=6. The number of servers 202-*j*-*i* included in the information processing system in the case of k=6 is $2^{6*}(2^6-1) \approx 2^{12} = 4096$.

According to the pseudocode of FIG. 13, even in the case where n is not a divisor of $2^k-1$, the partial bit string set can be generated.

Figure 14:
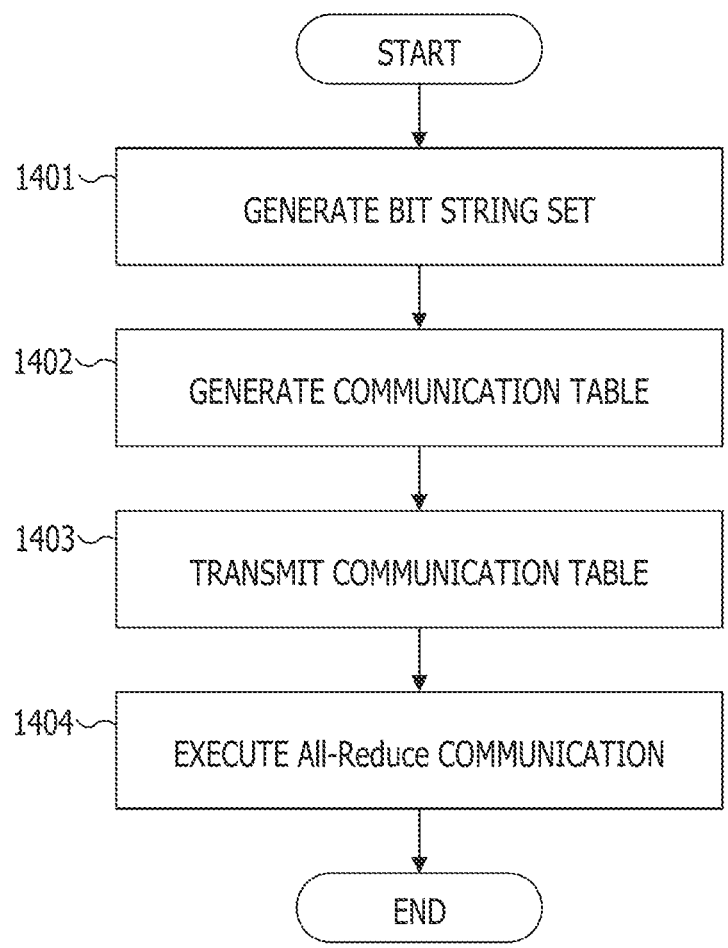
FIG. 14 is a flowchart of all-reduce communication.

FIG. 14 is a flowchart illustrating an example of the all-reduce communication in the information processing system of FIG. 2. First, the generation unit 411 of the control server 401 generates the bit string set 421 using the Galois field $GF(2^k)$ or the greedy algorithm based on the torus method (step 1401).

Next, the generation unit 411 generates the communication table 422 using the bit string set 421 (step 1402) and transmits the communication table 422 to each server 202-j-i that participates in the all-reduce communication via the communication unit 412 (step 1403).

Next, the communication unit 412 of each server 202-j-i executes the all-reduce communication by a message passing interface (MPI) (step 1404). In step 1404, the communication of the above-described procedures (P1) and (P2) is executed.

Figure 15:
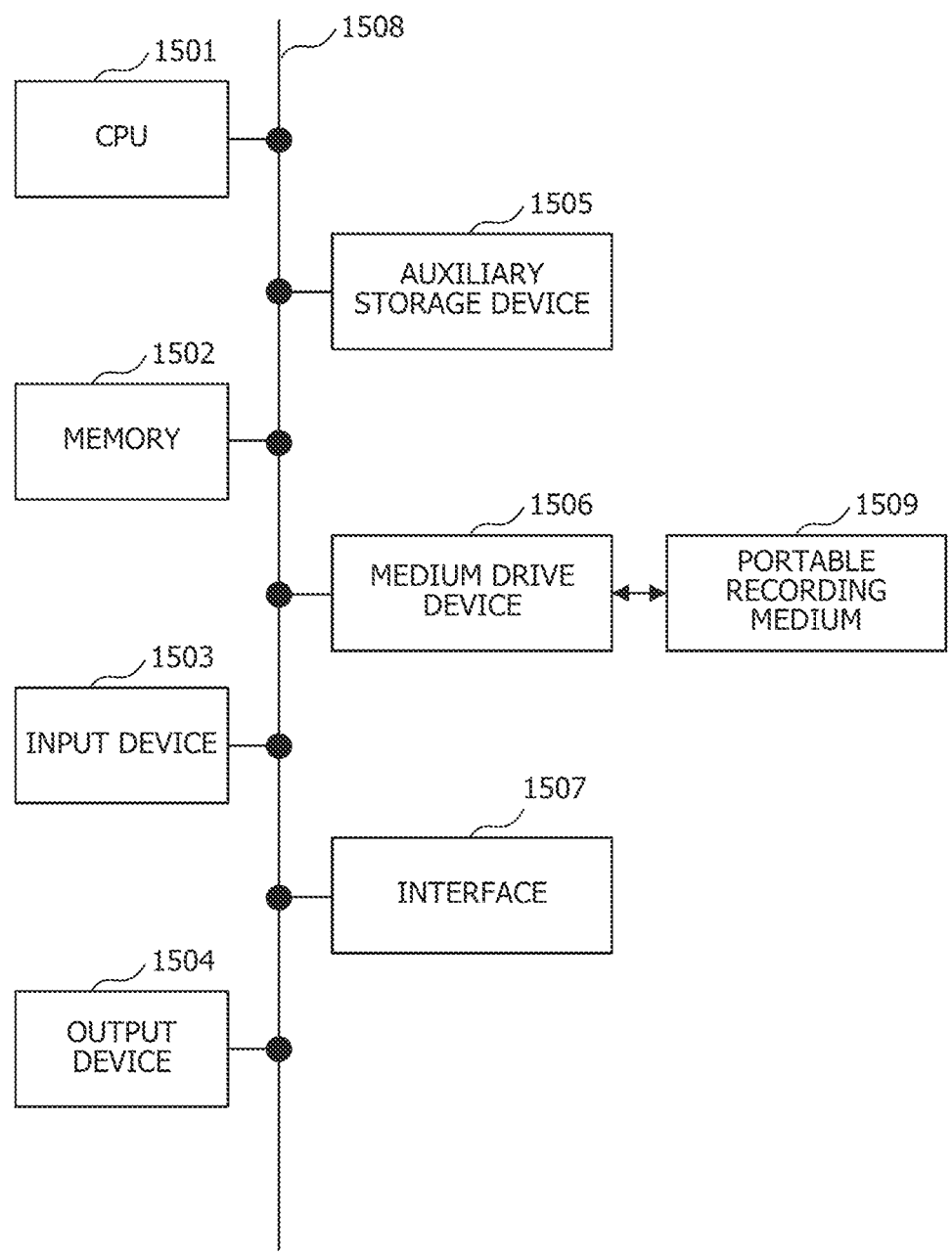
FIG. 15 is a hardware configuration diagram of a first information processing device.

FIG. 15 illustrates a hardware configuration example of a first information processing device used as the control server 401 in FIG. 4. The information processing device of FIG. 15 includes a central processing unit (CPU) 1501, a memory 1502, an input device 1503, an output device 1504, an auxiliary storage device 1505, a medium drive device 1506, and an interface 1507. These configuration elements are hardware and are connected to each other by a bus 1508.

The memory 1502 is, for example, a semiconductor memory such as a read only memory (ROM) or a random access memory (RAM) and stores programs and data to be used for processing. The memory 1502 may operate as the storage unit 413 in FIG. 4.

The CPU 1501 (processor), for example, executes a program using the memory 1502 so as to operate as the generation unit 411 in FIG. 4.

For example, the input device 1503 is a keyboard, a pointing device, or the like and is used for inputting instructions or information from a user or an operator. For example, the output device 1504 is a display device, a printer, or the like and is used for outputting an inquiry or an instruction to the user or the operator, and a processing result. The processing result may be a result of the parallel distributed processing.

For example, the auxiliary storage device 1505 is a magnetic disk device, an optical disk device, a magneto-optical disk device, a tape device, or the like. The auxiliary storage device 1505 may be a hard disk drive or a solid state drive (SSD). The information processing device may store programs and data in the auxiliary storage device 1505 and load these programs and data into the memory 1502 to use. The auxiliary storage device 1505 may operate as the storage unit 413 in FIG. 4.

The medium drive device 1506 drives a portable recording medium 1509 and accesses recorded contents of the portable recording medium 1509. The portable recording medium 1509 is a memory device, a flexible disk, an optical disk, a magneto-optical disk, or the like. The portable recording medium 1509 may be a compact disk read only memory (CD-ROM), a digital versatile disk (DVD), a universal serial bus (USB) memory, or the like. The user or the operator can store the programs and data in the portable recording medium 1509 and can use these programs and data by loading the programs and data into the memory 1502.

As described above, a computer-readable recording medium in which the programs and data to be used for processing are stored is a physical (non-transitory) recording medium such as the memory 1502, the auxiliary storage device 1505, or the portable recording medium 1509.

The interface 1507 is a communication circuit that is connected to the communication network 203 and performs data conversion associated with communication. The interface 1507 operates as the communication unit 412 in FIG. 4. The information processing device can receive programs and data from an external communication network (not illustrated) via the interface 1507, load the programs and data into the memory 1502, and use the programs and data.

Note that the information processing device does not need to include all the configuration elements in FIG. 15, and some configuration elements may be omitted depending on the use or conditions of the information processing device. For example, in a case where an interface with the user or the operator is not needed, the input device 1503 and the output device 1504 may be omitted. In a case of not using the portable recording medium 1509, the medium drive device 1506 may be omitted.

Figure 16:
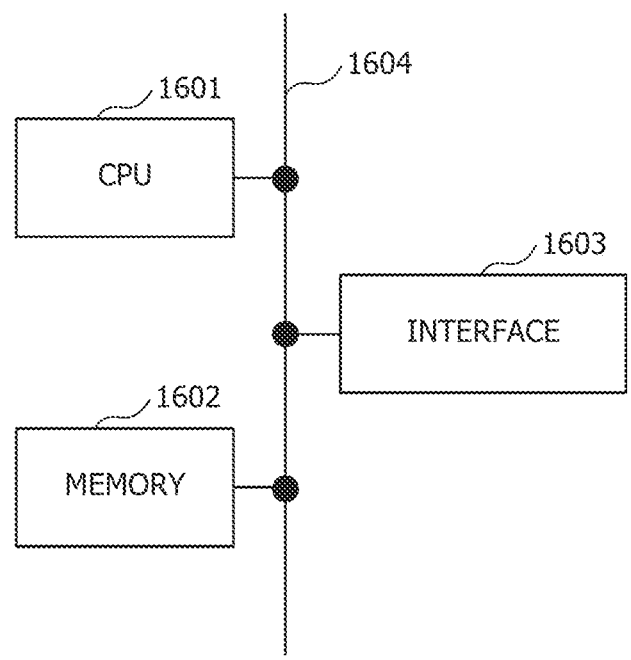
FIG. 16 is a hardware configuration diagram of a second information processing device.

FIG. 16 illustrates a hardware configuration example of a second information processing device used as the server 901 in FIG. 9. The information processing device of FIG. 16 includes a CPU 1601, a memory 1602, and an interface 1603. These configuration elements are hardware and are connected to each other by a bus 1604.

The memory 1602 is, for example, a semiconductor memory such as a ROM or a RAM, and stores programs and data to be used for processing. The memory 1602 operates as the storage unit 413 in FIG. 9.

The CPU 1601 executes the parallel distributed processing by executing a program using the memory 1602, for example.

The interface 1603 is a communication circuit that is connected to the communication network 203 and performs data conversion associated with communication. The interface 1603 operates as the communication unit 412 in FIG. 9.

The configuration of the information processing device 101 of FIG. 1 is merely an example, and some configuration elements may also be omitted or modified depending on the use or conditions of the information processing device 101.

The configurations of the information processing system of FIGS. 2 and 3 are merely examples, and some configuration elements may be omitted or modified depending on the use or conditions of the information processing system. The switch 201-j may be a switch for Ethernet (registered trademark) communication or for wireless communication.

The configurations of the control server 401 of FIG. 4 and the server 901 of FIG. 9 are merely examples, and some configuration elements may be omitted or modified depending on the use or conditions of the information processing system.

The configurations of the information processing devices of FIGS. 15 and 16 are merely examples, and some configuration elements may also be omitted or modified depending on the use or conditions of the information processing device.

The flowchart in FIG. 14 is merely an example, and some processes may be omitted or modified depending on the configuration or conditions of the information processing system.

The primitive polynomials illustrated in FIG. 5 are merely examples, and other primitive polynomials are used in a case where k is 6 or more. The bit string set 421 illustrated in FIGS. 6 and 7 is merely an example, and the bit string set 421 changes according to the value of k. The communication table 422 illustrated in FIG. 8 is merely an example, and the communication table 422 in another form may be used.

The all-reduce communication illustrated in FIGS. 10 to 12 is merely an example, and the all-reduce communication changes according to the values of k and n. The pseudocode illustrated in FIG. 13 is merely an example, and another pseudocode may be used to implement the greedy algorithm.

Expressions (1) to (21) are merely examples, and other expressions may be used to execute the collective communication.

While the disclosed embodiment and the advantages thereof have been described in detail, those skilled in the art will be able to make various modifications, additions, and omissions without departing from the scope of the present invention as explicitly set forth in the claims.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An information processing device coupled to a first switch among a plurality of switches and included in a plurality of information processing devices, comprising:
   a memory; and
   a processor coupled to the memory and configured to:
   store, in the memory, communication destination information based on a plurality of bit strings related to communication destinations of collective communication; and
   communicate with an information processing device connected to a second switch among the plurality of switches on a basis of the communication destination information, wherein some information processing devices that include the information processing device among the plurality of information processing devices participate in the collective communication, and the plurality of bit strings is selected from a bit string set related to the communication destinations of the plurality of information processing devices on a basis of the number of the some information processing devices,
   the communication destination information includes a second bit string that indicates the second switch, the second bit string being obtained by exclusive OR of a first bit string that indicates the first switch and one of the plurality of bit strings.

2. The information processing device according to claim 1, wherein the bit string set is a bit string set related to the communication destinations of a case where the plurality of information processing devices participates in the collective communication, a length of each bit string included in the bit string set is k bits, k is an integer equal to or greater than 2, any consecutive k bit strings are linearly independent when the bit strings included in the bit string set are arranged in a circle, and any consecutive k bit strings are linearly independent when the plurality of bit strings is arranged in a circle.

3. The information processing device according to claim 2, wherein the number of the plurality of switches is $2^k$, a connection configuration of the plurality of switches is full mesh, and the number of information processing devices connected to each of the plurality of switches is $2^{k-1}$.

4. The information processing device according to claim 2, wherein each bit string included in the bit string set corresponds to an element of a Galois field generated from a kth-order primitive polynomial, and each bit string included in the plurality of bit strings corresponds to an element specified on the basis of the number of some information processing devices among a plurality of elements of the Galois field.

5. The information processing device according to claim 1, wherein the plurality of bit strings is selected from the bit string set by a greedy algorithm that uses the number of some information processing devices.

6. An information processing method comprising:
   store, by an information processing device coupled to a first switch among a plurality of switches and included in a plurality of information processing devices, in a memory, communication destination information based on a plurality of bit strings related to communication destinations of collective communication; and
   communicate with an information processing device connected to a second switch among the plurality of switches on a basis of the communication destination information, wherein some information processing devices that include the information processing device among the plurality of information processing devices participate in the collective communication, and the plurality of bit strings is selected from a bit string set related to the communication destinations of the plurality of information processing devices on a basis of the number of the some information processing devices,
   the communication destination information includes a second bit string that indicates the second switch, the second bit string being obtained by exclusive OR of a first bit string that indicates the first switch and one of the plurality of bit strings.

7. The information processing method according to claim 6, wherein the bit string set is a bit string set related to the communication destinations of a case where the plurality of information processing devices participates in the collective communication, a length of each bit string included in the bit string set is k bits, k is an integer equal to or greater than 2, any consecutive k bit strings are linearly independent when the bit strings included in the bit string set are arranged in a circle, and any consecutive k bit strings are linearly independent when the plurality of bit strings is arranged in a circle.

8. The information processing method according to claim 7, wherein the number of the plurality of switches is $2^k$, a connection configuration of the plurality of switches is full mesh, and the number of information processing devices connected to each of the plurality of switches is $2^{k-1}$.

9. The information processing method according to claim 7, wherein each bit string included in the bit string set corresponds to an element of a Galois field generated from a kth-order primitive polynomial, and each bit string included in the plurality of bit strings corresponds to an element specified on the basis of the number of some information processing devices among a plurality of elements of the Galois field.

10. The information processing method according to claim 6, wherein the plurality of bit strings is selected from the bit string set by a greedy algorithm that uses the number of some information processing devices.

\* \* \* \* \*